(12) United States Patent
Palais et al.

(10) Patent No.: US 8,278,954 B2
(45) Date of Patent: Oct. 2, 2012

(54) ELECTRICALLY MODULATABLE EXTENDED LIGHT SOURCE AND A MEASUREMENT DEVICE FOR CHARACTERIZING A SEMICONDUCTOR INCLUDING ONE SUCH SOURCE

(75) Inventors: Olivier Palais, Marseilles (FR); Marcel Pasquinelli, St. Savournin (FR)

(73) Assignee: Universite Paul Cezanne, Aix en Provence Cedex (FR)

( * ) Notice: Subject to any disclaimer, the term of this patent is extended or adjusted under 35 U.S.C. 154(b) by 933 days.

(21) Appl. No.: 12/278,011

(22) PCT Filed: Jan. 31, 2007

(86) PCT No.: PCT/EP2007/050950
§ 371 (c)(1),
(2), (4) Date: Dec. 8, 2008

(87) PCT Pub. No.: WO2007/088176
PCT Pub. Date: Aug. 9, 2007

(65) Prior Publication Data
US 2012/0133384 A1    May 31, 2012

(30) Foreign Application Priority Data
Feb. 3, 2006 (FR) ...................................... 06 50388

(51) Int. Cl.
*G01R 31/302* (2006.01)
(52) U.S. Cl. ............................... 324/754.31; 324/750.12
(58) Field of Classification Search ............. 324/754.31
See application file for complete search history.

(56) References Cited

U.S. PATENT DOCUMENTS

| | | | |
|---|---|---|---|
| 2,790,141 A * | 4/1957 | Geppert ................... | 324/762.01 |
| 6,437,592 B1 * | 8/2002 | Polignano et al. ....... | 324/762.01 |
| 2005/0196882 A1 | 9/2005 | Steeples | |

FOREIGN PATENT DOCUMENTS
JP         2000154094 A      6/2000
WO    WO2007/088176 A1 *  9/2007

OTHER PUBLICATIONS

O. Palais, A. Arcari: "Contactless measurement of bulk lifetime and surface recombination velocity in silicon wafers" Journal of Applied Physics, vol. 93, No. 8, Apr. 15, 2003, pp. 4686-4690, XP002397643.
O.Palais, L. Clerc, A. Acari, M. Stemmer, S. Martinuzzi: "Mapping of minority carrier lifetime and mobility in imperfect silicon wafers" Materials Science and Engineering B, Elsevier Sequoia, Lausanne, CH, vol. 102, No. 1-3, Sep. 15, 2003, pp. 184-188, XP004450726.

* cited by examiner

*Primary Examiner* — Thomas Valone
(74) *Attorney, Agent, or Firm* — Perman & Green, LLP

(57) ABSTRACT

A light source for injecting excess carriers into a semiconductor wafer, fully illuminating a surface of the wafer. According to the disclosed embodiments, the source includes at least one set of point sources which are spaced apart at regular intervals along the X and Y axes, such that the source emits a monochromatic beam of a size that is at least equal to that of the semiconductor wafer surface to be illuminated. Each of the point sources is sinusoidally modulated by a common electrical modulator, the distance between two point sources and the distance between the source and the semiconductor wafer surface to be illuminated being selected such that the monochromatic light beam uniformly illuminates the surface.

11 Claims, 3 Drawing Sheets

ELECTRICALLY MODULATABLE EXTENDED LIGHT SOURCE AND A MEASUREMENT DEVICE FOR CHARACTERIZING A SEMICONDUCTOR INCLUDING ONE SUCH SOURCE

CROSS REFERENCE TO RELATED APPLICATIONS

This application is the National Stage of International Application No. PCT/EP2007/050950 International Filing Date, 31 Jan. 2007, which designated the United States of America, and which International Application was published under PCT Article 21 (2) as WO Publication No. WO2007/088176 and which claims priority from French Application No. 0650388, filed on 3 Feb. 2006, the disclosures of which are incorporated herein by reference in their entireties.

BACKGROUND

1. Field

The disclosed embodiments concern an electrically modulable and extended light source designed to inject excess carriers into a semiconductor wafer, thereby illuminating it. In particular, this source, by having a measurement device, makes it possible to characterize electrical properties of this semiconductor wafer, such as the volume lifetime and the rate of surface recombination of the minority carriers of a semiconductor wafer. The disclosed embodiments apply more particularly to the field of the photovoltaic industry and microelectronics.

2. Brief Description of Related Developments

New electronic components and the future generation of devices within microelectronic technology, and especially in the field of very large scale integration of integrated circuits, require starting materials of increasingly better purity, and the same is true of photovoltaic cells. Metals are primarily responsible for contamination of silicon wafers. The presence of these metals reduces the performance, reliability, and the ratio of these devices, that is, the number of "good" devices of a silicon wafer divided by the total number of devices on this same wafer. For example, in transistors, alkaline metals introduce a mobile charge in the thin oxide layer which then neutralizes the insulating properties of oxides. Moreover, the transition metals act like electron traps. Thus, a concentration of impurities greater than $10^{10}$/cm3 can render a silicon wafer totally unusable for the manufacture of certain devices.

Thus, contamination represents a relatively costly threat to the microelectronics industry and it is thus necessary to measure and control this contamination during the course of the integrated circuit manufacturing process.

Furthermore, while the threat is considered less critical to the photovoltaic industry, metal contamination can degrade the conversion yield of the cells and it can then exert an influence on the sales price of the end product.

The physico-chemical techniques traditionally used to measure the contamination are not applicable to a production line inspection. It would be necessary to extract aqueous solutions of metal contaminants from the wafer and then measure them by spectroscopic methods. These techniques are too long, too costly and destructive, and so not applicable to a use on the production line.

Techniques based on the measurement of the electrical effects of the contamination rather than the concentration of the impurities have been proposed, such as the technique of decrease in photoconductivity at ultrahigh frequency (micro-PCD). These techniques involve measuring the lifetime of the minority carriers $\tau b$ in the semiconductor wafer, the lifetime of the minority carriers being a parameter connected to the concentration of impurities.

However, the measurement of this parameter $\tau b$ is tied to the rate of surface recombination S, and it is not easy to extract its value directly. The alternative techniques proposed generally measure an effective lifetime $\tau eff$, which is at the same time related to $\tau b$ and S. In order to be able to extract $\tau b$, it is thus necessary either to determine in very precise manner the value of S or to render the rate of recombination S negligible in relation to $\tau b$. Generally, the solution proposed consists in a supplementary step of passivation of the surface of the silicon wafers prior to the measurement step. However, this surface passivation step is not very adapted for use on the production line, since on the one hand it is liable to damage the wafer and, on the other hand, it causes an additional delay in the process of measurement and quality inspection of the wafer, thus leading to a further production cost.

The document J. Appl. Physic. Vol. 93, No 8 (2003) describes another alternative measurement technique based on measuring the microwave phase shift between the modulation signal of an exciting light source and the microwaves reflected by a semiconductor wafer so illuminated by the exciting light source. Contrary to the techniques previously mentioned, this technique makes it possible to independently access the volume lifetime of the minority carriers $\tau b$ and the rates of surface recombinations S in the semiconductor wafer without having to proceed with a passivation of the surfaces of the wafer.

SUMMARY

The device comprises two sources. The first source is a laser photon exciting source emitted in the near infrared, modulated at a low frequency f. This source, emitting a monochromatic light beam with a diameter between 25 and 50 μm, locally illuminates one of the two surfaces of the semiconductor wafer, and thus creates a certain population of excess carriers in the specimen. The second source is a microwave probe source which emits a microwave field at 10 GHz. This second microwave source irradiates the same specimen at the same time as the first source, but at the surface not illuminated by the first source. The properties of the reflected microwaves depend on the density or population of carriers induced by the first laser source; by measuring the phase shift $\Delta\phi$ of the microwaves of the reflection as a function of the frequency of modulation f, one can determine the electrical properties of the wafer, namely, the volume lifetime $\tau b$ and the rate of surface recombination S of the minority carriers.

However, this device most particularly lets one establish a mapping of the volume lifetime of the wafer. In fact, the measurement device involved in this measurement technique contains a small source modulated sinusoidally about a constant level of illumination. This device can only measure locally the lifetime of the carriers of the wafer, so it is necessary to repeat the measurements to be able to scan the entire surface of the sheet by moving the photon exciting source zone by zone so as to draw up a map (S, $\tau b$) of the wafer. This device thus needs a relatively long measurement time to obtain the data for the lifetime of the carriers for the entire wafer, generally it takes several hours to draw up the maps. Therefore, this source makes the measurement technique and the associated device unsuited to measurements of volume lifetime and inspection for impurity contamination on the production line.

Now, in the microelectronics and photovoltaic industry, it is imperative to have a simple measurement technique, able to perform the measurement rapidly and adapt itself to the size of the semiconductor wafer.

The aspect of the disclosed embodiments is to propose a light source of simple concept and simple operating mode, making possible global measurements on a specimen, in particular this source being combined with a measurement device makes it possible to determine, quickly and effectively on the production line, a volume lifetime τb and the rates of surface recombinations S of the minority carriers of a semiconductor wafer in the course of the manufacturing process for integrated circuits and photovoltaic cells, which lets one reveal, among other things, a possible metallic contamination through the measurement of the lifetime of the minority carriers.

In particular, this source should adapt itself to every type of material of the semiconductor wafer and it should illuminate in homogeneous fashion the entire surface of the wafer, regardless of its size, thus making possible global measurements and obtaining a mean value for the volume lifetime and the rate of recombination of the minority carriers in a single measurement.

For this purpose, the disclosed embodiments concern a light source intended to inject excess carriers into a semiconductor wafer, fully illuminating a surface of this semiconductor wafer.

According to the disclosed embodiments, this source includes at least one set of point sources, which are spaced apart at regular intervals along the X and Y axes, such that the source emits a monochromatic beam of a size that is at least equal to that of the semiconductor wafer surface to be illuminated, each of the point sources is sinusoidally modulated by a common electrical modulator, the distance (d) between two point sources and the distance (D) between the source and the semiconductor wafer surface to be illuminated being selected such that the monochromatic light beam uniformly illuminates said surface.

In different possible embodiments, the disclosed embodiments also involves the characteristics which will emerge in the course of the following specification and which should be considered in isolation or in all possible technical combinations of them:

the electrical modulator modulates the sources in a frequency range between 1 Hz and 100 kHz, in one particular embodiment, each point source is a fiber-coupled laser diode, in another particular embodiment, each point source is an electroluminescent diode, the interval distance (d) between two diodes is preferably between 0 cm and 1.5 cm, a neutral diffusion filter is preferably placed between the source and the surface of the object being illuminated to make the light beam emitted by the source more uniform.

The disclosed embodiments also concern a device comprising this light source for the measurement of the volume lifetime and the rate of surface recombination of the minority carriers of a semiconductor wafer, this device further comprising:

the electrical modulator having an output to energize the light source and a reference signal output of identical frequency to the modulation frequency f of the light source, a probe source, to create a wave field, the waves emitted irradiating the nonilluminated surface of said semiconductor wafer, a waveguide or an antenna making it possible to channel the waves emitted onto the nonilluminated surface of said semiconductor wafer and the waves reflected to a microwave detector, said waveguide or said antenna associated with said microwave detector being designed to pick up the signal produced by the waves reflected from said semiconductor wafer thus excited by said light source, a control unit receiving the reference signal coming from one of the two outputs of the electrical modulator and the signal of reflected waves at the output of said detector, the signal of reflected waves being measured at the frequency f of the reference signal, a signal processing unit receiving the measurement of the shift Δφ of the reflected waves from the control unit to extract two parameters of the semiconductor wafer, namely, the lifetime of the minority carriers τb and the rate of surface recombination S.

BRIEF DESCRIPTION OF THE DRAWINGS

The disclosed embodiments shall be described in further detail in various possible embodiments, making reference to the enclosed drawings, where.

DETAILED DESCRIPTION OF THE DISCLOSED EMBODIMENTS

Figure 1A:
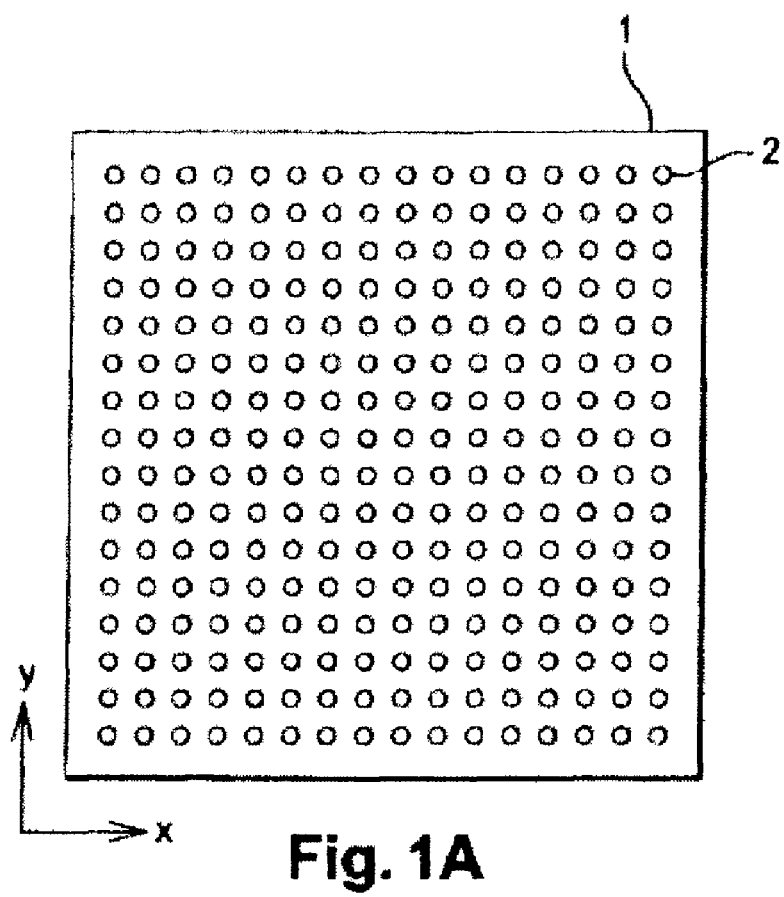
FIG. 1.A shows schematically a plan view of one light source of the disclosed embodiments, comprising a group of point sources arranged at regular intervals, and FIG. 1.B is a profile view of a line of point sources from FIG. 2.
Figure 1B:
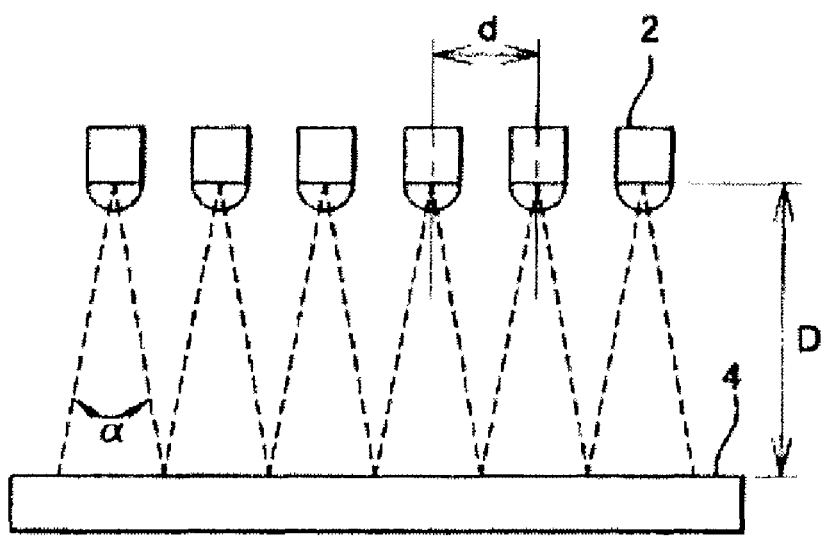

The disclosed embodiments concern a light source designed to inject excess carriers into a semiconductor wafer, thereby illuminating a surface of this semiconductor wafer in continuous and modulated fashion. FIG. 1.A shows a top view of one example of this light source, which has a rectangular geometry. The shape of the source can also be circular or oval.

The light source has a set of point sources 2 spaced at regular intervals in the X direction and in the Y direction, thus forming an array of point sources. All these point sources each emit a monochromatic beam and the same wave length, so that the overall source emits a monochromatic beam. The dimension of the beam emitted by the source 1 is at least equal to that of the surface being illuminated of the semiconductor wafer.

Advantageously, the distance (d) between two point sources and the distance (D) between the source and the surface being illuminated of the semiconductor wafer are chosen such that the monochromatic light beam uniformly illuminates the entire surface being illuminated of the semiconductor wafer.

This uniform illumination of the entire surface of a semiconductor wafer makes it possible to modify the population of carriers in the entire semiconductor wafer.

The size of the source varies as a function of the number of point sources making it up, thus advantageously offering a flexibility to easily adapt the size of the light beam emitted by the source as a function of the size of the semiconductor wafer being irradiated.

Preferably, for a measurement of the entire semiconductor wafer, the size of the illumination panel is at least equal to the size of the semiconductor wafer.

All the point sources 2 are energized by a common electrical modulator and each of these point sources is modulated sinusoidally by a common electrical modulator at a frequency f.

Preferably, this electrical modulator works in a frequency range f between 1 Hz and 100 kHz.

Advantageously, the wave length of the beam emitted by the light source can be modified as a function of the material of the semiconductor wafer being studied, by replacing the group of point sources with other point sources having an adequate wave length.

In one particular embodiment, the light source may comprise several sets of point sources, each emitting a monochromatic beam of different wave length. Thus, to vary the wave length of the light source, it is enough to choose one of the sets of point sources emitting the light beam of adapted wave length.

In one embodiment, the point source 2 is a fiber-coupled laser diode and the light source comprises a set of fiber-coupled laser diodes. Preferably, a focus lens is placed at the output of each fiber-coupled laser diode.

In another embodiment, each point source is an electroluminescent diode and the light source comprises a set of electroluminescent diodes.

To achieve a uniform light beam over the entire surface of the semiconductor wafer, one needs to generalize an optimal configuration of arrangement of these point sources, regardless of the type of point source used.

Preferably, the interval distance (d) between two diodes is between 0 cm and 1.5 cm, so as not to have marked zones of shadow, or overexposed zones due to overlapping between two small beams. The distance (D) between the light source and the surface being illuminated for the semiconductor wafer depends on the type of source used.

Advantageously, this configuration of arrangement of the point sources can be generalized regardless of the angle of emission $\alpha$ of the electroluminescent diodes and regardless of the focus distance of the lenses placed at the output of the fiberoptics in the case when the point sources are fiber-coupled laser diodes.

FIG. 1.B shows schematically a configuration example in which the point sources are electroluminescent diodes having a mean angle of emission $\alpha$ equal to 30 degrees. The distance between two diodes, referenced (d) in FIG. 1.B, is equal to 1 cm, in this case a distance between the light source and the surface being illuminated of semiconductor wafer, referenced (D) in FIG. 1.B, is equal to 5 cm to obtain a uniform illumination on the entire surface of the semiconductor wafer.

Figure 2:
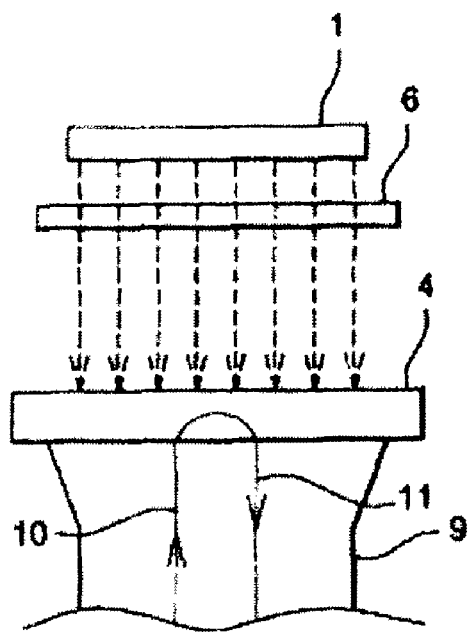
FIG. 2 is a profile view of the light source in a configuration of direct illumination of a semiconductor wafer.

FIG. 2 shows a first configuration of illumination where the light source is placed on top of the surface being illuminated of the semiconductor wafer.

Figure 3:
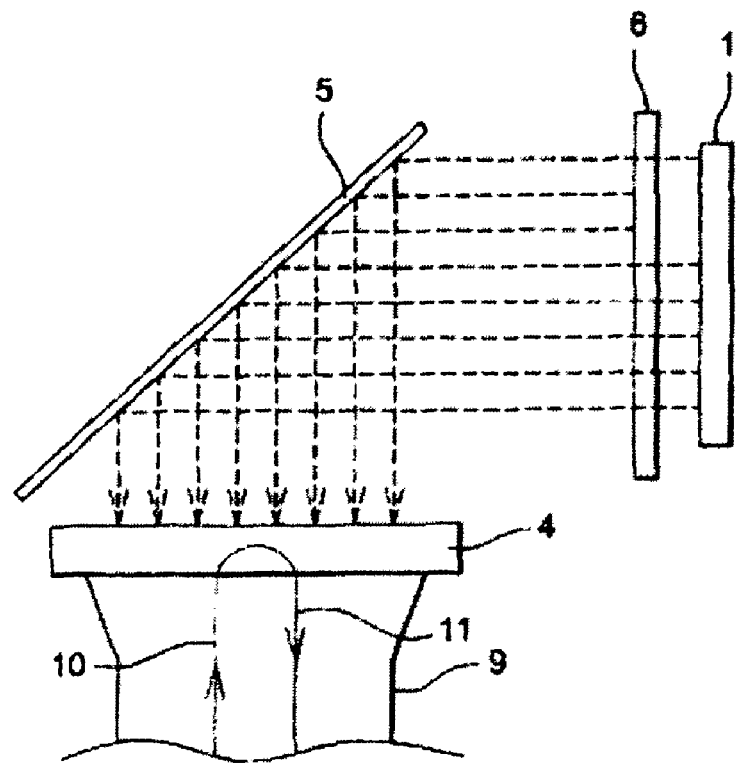
FIG. 3 is a profile view of the light source in a configuration of indirect illumination of a semiconductor wafer, the source being arranged at 90° with respect to the semiconductor wafer.

In another illumination configuration, shown schematically in FIG. 3, the surface of the semiconductor wafer is illuminated indirectly by the source, which is placed at 90 degrees relative to the surface being illuminated of the semiconductor wafer 4. The light beam of the source is than relayed by means of a mirror 5 placed at 45 degrees between the light source and the semiconductor wafer.

Preferably, a neutral diffusion filter 6 is placed between the source and the semiconductor wafer to make the light beam emitted by the light source 1 even more uniform.

Figure 4:
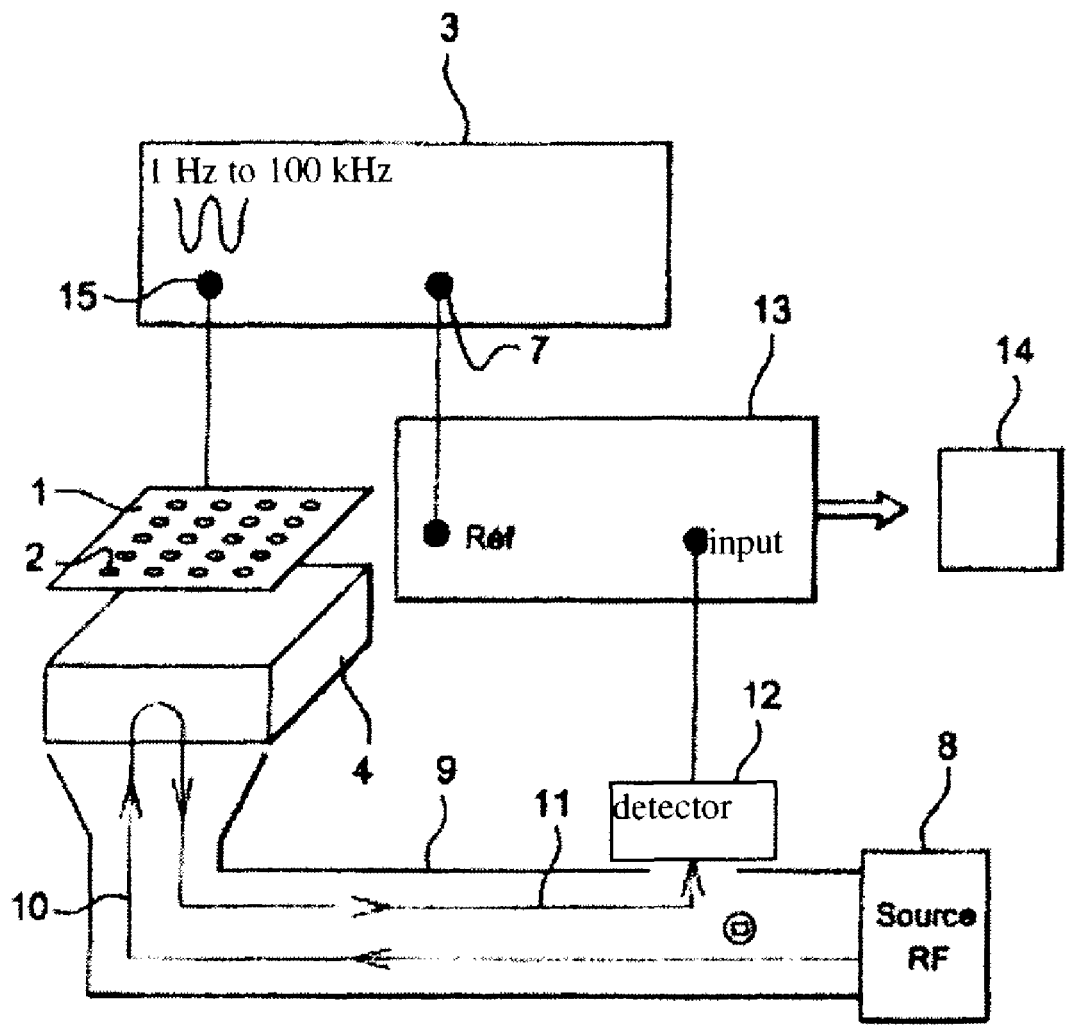
FIG. 4 shows schematically a measurement device containing a light source of the disclosed embodiments to determine the volume lifetime and the rate of surface recombination of the minority carriers of a semiconductor wafer.

FIG. 4 describes a measurement device comprising a light source 1 as described above for the study of semiconductor materials, this device being intended to measure the volume lifetime and the rate of surface recombination of the minority carriers in a semiconductor wafer 4. This measurement device is based on the technique of a phase shift in the waves reflected by the nonilluminated surface of the wafer. The light source illuminates in continuous and modulated fashion the entire surface of the semiconductor wafer so as to inject free carriers there, the level of injection being almost constant during the illumination of the surface of the semiconductor wafer. Thus, this source creates in the entire wafer a population of excess carriers.

The device contains an electrical modulator 3 which energizes the light source via a first output 15 and at the same time sends a reference signal via another output 7 to a control unit 13 in order to give it the phase reference and modulation frequency f of the light source.

The device, moreover, contains a second wave probe source 8, which subjects the semiconductor wafer to a field of waves on the surface not illuminated by the photon exciting source.

In general, the wave source is a microwave source and one uses a Gunn effect diode working in the X band as the microwave source.

Preferably, the microwave source emits a microwave field at a frequency of 10 GHz, thus irradiating the nonilluminated surface of the semiconductor wafer 4.

It is possible to also use a radio-frequency wave source, working in a radio frequency spectrum between the VHF band and the X band.

The principle of the microwave phase shift measurement is as follows. When the semiconductor wafer 4 is fully subjected to the sinusoidally modulated excitation light of the source, a global change in the density of the minority carriers is created, inducing a sinusoidal change in the coefficient of reflection of the microwaves. A waveguide or an antenna 9 making it possible to direct the waves 10 emitted onto the nonilluminated surface of the semiconductor wafer and the waves 11 reflected toward a microwave detector 12, this waveguide or this antenna associated with the detector being intended to pick up the signal produced by the microwaves reflected by the semiconductor wafer 4 thus excited.

By measuring a phase shift $\Delta\phi$ between the modulation signal of the light source and the signal coming from the detector 12 of the reflected microwaves, one can extract the values of S and $\tau b$ indicative of the electrical properties of the semiconductor wafer.

Generally, the control unit 13 is a phase meter.

In the case of a noisy signal and/or one of low amplitude, the control unit 13 is a synchronous detector so as to improve the signal to noise ratio. A signal processing unit 14 is connected to this control unit 13 so as to automatically process from the data sent by the control unit to extract the parameters S and $\tau b$.

Furthermore, regardless of the mode of implementation of the light source, in order for the change in density of the minority carriers to be sufficient to induce a significant change in the coefficient of reflection of the microwaves, the power provided by the light source should enable an injection of free carriers at least greater than $10^{-5}$ times the doping of the semiconductor wafer.

Advantageously, all of the different elements making up the measurement device as shown in FIG. 4 are automated by a computer program. And a computation program makes it possible to automatically extract the parameters $\tau b$ and S from the measured pairs (f, $\Delta\phi$).

Advantageously, the light source of the disclosed embodiments make it possible to perform global measurements of these parameters τb, S, which are the electrical properties of the semiconductor wafer. Thus, this light source coupled with a measurement device for the volume lifetime τb and the rate of surface recombination S of the minority carriers makes it possible to rapidly and effectively measure and control the metallic contamination and the crystallographic defects of the semiconductor wafer in the course of the different stages of the process of manufacture of integrated circuits and photovoltaic cells.

The invention claimed is:

1. A light source intended to inject excess carriers into a semiconductor wafer, thus illuminating a surface of said semiconductor wafer, wherein this source includes at least one set of point sources, which are spaced apart at regular intervals along the X and Y axes, such that the source emits a monochromatic beam of a size that is at least equal to that of the semiconductor wafer surface to be illuminated, each of the point sources is sinusoidally modulated by a common electrical modulator, the distance between two point sources and the distance between the source and the semiconductor wafer surface to be illuminated being selected such that the monochromatic light beam uniformly illuminates said surface of said semiconductor wafer.

2. The light source per claim 1, wherein the electrical modulator modulates each of said point sources in a frequency range between 1 Hz and 100 kHz.

3. The light source per claim 1, wherein each point source is a fiber-coupled laser diode.

4. The light source per claim 3, wherein a focus lens is placed at the output of each fiber-coupled laser diode.

5. The light source per claim 1, wherein each point source is an electroluminescent diode.

6. The light source per claim 1, wherein the interval distance between two point sources is preferably between 0 cm and 1.5 cm.

7. The light source per claim 4, wherein the lenses can have any given focal distance.

8. The light source per claim 5, wherein said electroluminescent diodes can have any desired angle of emission α.

9. The light source per claim 1, wherein said source is placed opposite the surface being illuminated of said semiconductor wafer.

10. The light source per claim 1, wherein said source is placed at 90 degrees relative to the surface being illuminated of the semiconductor wafer, the light beam emitted by said source being relayed by means of a mirror placed at 45 degrees between said source and said semiconductor wafer.

11. The light source per claim 1, wherein a neutral diffusion filter is placed between said source and said semiconductor wafer to make the light beam emitted by said source even more uniform.

* * * * *